_United States Patent_ [19]

Norman et al.

[11] Patent Number: 4,604,718

[45] Date of Patent: Aug. 5, 1986

[54] COMPUTER SIMULATION SYSTEM

[75] Inventors: Theodore A. Norman, Lindon; Van B. Norman, Centerville, both of Utah

[73] Assignee: Simulated Designs, Ltd., Salt Lake City, Utah

[21] Appl. No.: 488,095

[22] Filed: Apr. 25, 1983

[51] Int. Cl.[4] .................. G06F 15/16; G06F 15/62
[52] U.S. Cl. ................................ 364/578; 364/900; 434/428
[58] Field of Search ............ 364/200, 900, 468, 578; 434/428

[56] References Cited

U.S. PATENT DOCUMENTS

| | | | |
|---|---|---|---|
| 4,215,406 | 7/1980 | Gomola et al. | 364/468 |
| 4,389,706 | 6/1983 | Gomola et al. | 364/468 X |
| 4,512,747 | 4/1985 | Hitchens et al. | 434/428 |

Primary Examiner—Felix D. Gruber
Attorney, Agent, or Firm—Workman, Nydegger & Jensen

[57] ABSTRACT

A computer system for simulating a user-specified automated manufacturing and/or materials handling facility. The system includes a CPU interconnected to an operator terminal through which information is entered by a designer who specifies various computer-controlled components and operating parameters which are to be tested in a particular design. The system designer is provided with a catalog of user-oriented language descriptions of available components from which he can select the various components and their operating parameters. The user-oriented language descriptions entered by the system designer are used by the CPU to automatically create an operational prototype model for each selected component, which is then compiled by the CPU into a corresponding series of general purpose simulation statements which are processed to determine the simulated operation of the automated manufacturing and/or materials handling facility design. The CPU can be linked to a graphics system to produce an animated graphical display of the simulated operation of the proposed facility design.

14 Claims, 14 Drawing Figures

Microfiche Appendix Included
(5 Microfiche, 281 Pages)

DESTINATION ARRAY

| Population Limit (120) | P & D Status (121) | Work List Pointer (122) | Park List Pointer (123) | Delivery Protocol Pointer (124) | Retrieve Protocol Pointer (125) | Parking Protocol Pointer (126) | Intermediate Protocol Pointer (127) | Load Destination (128) | Current Population (129) |
|---|---|---|---|---|---|---|---|---|---|
| | | | | | | | | | |
| | | | | | | | | | |
| | | | | | | | | | |

Fig. 3e

SECTION ARRAY

| Size (137) | Time (138) | Window (139) | Type (140) | Matrix Size (141) | Motor Block Pointer (142) | Pointer to Transfer Array (143) | Pointer to Navigation Array (144) |
|---|---|---|---|---|---|---|---|
| | | | | | | | |
| | | | | | | | |
| | | | | | | | |

Fig. 4a

NAVIGATION ARRAY

| Destination Pointer #1 (149) | Destination Pointer #2 (150) | Destination Pointer #3 (151) | Destination Pointer #4 (152) |
|---|---|---|---|
| | | | |
| | | | |
| | | | |

Fig. 4b

TRANSFER ARRAY

| Location (157) | Next Drive (158) | Next Drive Location (159) | Type (160) | Time (161) |
|---|---|---|---|---|
| | | | | |
| | | | | |
| | | | | |

Fig. 4c

TASK TYPE ARRAY

| | List Size | First Task Node Pointer | Last Task Node Pointer |
|---|---|---|---|
| 164 | | | |
| 165 | | | |
| 166 | | | |
| | ≈ | ≈ | ≈ |

TASK NODE ARRAY

| | Task Type | Time Task Was Created | Next Node Pointer |
|---|---|---|---|
| 171 | | | |
| 172 | | | |
| 163 | | | |
| 173 | ≈ | ≈ | ≈ |

Fig. 5b

COMPUTER SIMULATION SYSTEM

A computer program listing which comprises Appendices A-E is referred to hereinafter in the specification and has been provided on microfiche pursuant to 37 C.F.R. §1.96(b).

I. BACKGROUND

A. Field of the Invention

This invention relates to computer simulation systems and, in particular, to a computer system for simulating a user-specified automated manufacturing and/or materials handling facility.

B. Prior State of the Art, and Principal Objects of the Invention

Over the last decade digital computers, including minicomputers and microprocessors, have increasingly been used to automate materials handling and manufacturing facilities. Particularly in large scale operations, automation of manufacturing and warehousing facilities may result in significant savings due to increased efficiency and fewer errors. However, automated manufacturing and/or materials handling (AM/MH) facilities are expensive to properly design, install and make operational.

The high costs which are associated in acquiring and installing automated equipment such as storage/retrieval (S/R) machines, automatic guided vehicles (AGVs), automated conveyor systems, and automated machining centers underscores the importance of properly designing the overall system at the outset. Obviously, it is extremely disadvantageous and expensive to install sophisticated automated machines and equipment only to later find out that the equipment is not able to properly function in the system and does not integrate properly with the other computer-controlled components of the facility.

In the past, design, installation and testing of automated manufacturing and materials handling facilities has been approached in basically one of two ways. One way is to simply install the system after it is designed, and then to manually debug the system by trial and error. This procedure is both time consuming and inefficient. It requires that the valuable time of skilled operators as well as the time of the computer-controlled components be used to "walk through" the system operation under various operating conditions in order to correct any conflicts in the routing, performance or operation of the components.

For example, it may happen that two or more wire-guided vehicles of the facility are not properly programmed and may reach an intersection in their routing at the same time. These types of errors must of course be corrected in order for the automated manufacturing or materials handling facility to operate properly. In the worst case, it may happen that the particular components selected for the system simply are not capable of functioning properly in the overall system design. For example, a wire-guided vehicle system may not be able to properly service all of the loads which are supplied to it by an automated conveyor system. In that case, expensive and costly design changes must be made to the system after installation.

The other basic approach which has been used to accomplish design and installation of automated manufacturing and materials handling facilities involves the development and testing of computer simulated models of the system using GPSS or other general purpose simulation languages. This approach has the important advantage that before making the final investment to purchase and install the complex and expensive computer-controlled components which make up a particular design for an automated manufacturing or materials handling facility, the user can test the operation of the model to determine whether it will perform as expected in response to given parameters or conditions simulating those of the actual facility.

Once developed, the model can be used to evaluate alternative designs in order to optimize the final design and operation of the facility. For many types of automated manufacturing or materials handling facilities, this type of computer simulation has been the most efficient and accurate way of developing a system design. For facilities which are extremely complex, computer simulation is perhaps the only practical approach to solving the design problem.

The disadvantage to computer simulation of automated manufacturing or materials handling facilities is that the problem of developing the simulation model is itself so complicated and difficult that historically it requires the use of someone who has been specially trained in the use of general purpose simulation languages and programming techniques based on such languages. However, generally such experts are not experienced in solving particular design problems in the art of automated manufacturing or materials handling. Thus, it is not uncommon for these types of experts to spend substantial time and effort working with automated manufacturing and materials handling designers in order to understand the basic parameters which they will need to use in order to develop a simulation model of such a facility. This of course increases the time, risk and expense involved in developing such models, and is a serious drawback.

In view of the aforementioned problems and prior state of the art, it is a primary object of the present invention to provide a computer system which can be easily used by designers of automated manufacturing or materials handling facilities to efficiently and inexpensively generate simulation models of such facilities without having to rely upon the assistance of experts who are specially trained in computer simulation and programming techniques based on general simulation languages.

Another principal object of this invention is to provide a computer system for simulating a user-specified automated manufacturing and/or materials handling facility which easily and accurately predicts the response of the facility to certain operating parameters and conditions so as to permit alternate designs to be evaluated in order to optimize facility design.

Yet another principal object of the present invention is to provide a computer system for simulating a user-specified automated manufacturing and/or materials handling facility which is significantly less expensive, more accurate and more efficient to use than present state-of-the-art general or special purpose simulation systems.

These and other objects and features of the present invention will become more fully apparent from the following description and appended claims, taken in conjunction with the accompanying drawings.

II. BRIEF SUMMARY OF THE INVENTION

In accordance with the foregoing principal objects, the present invention significantly advances the art of computer simulation for automated manufacturing and/or materials handling facilities by providing a computer simulation system which can be easily and efficiently used by designers who are skilled in the art of automated maufacturing or materials handling design but who are not necessarily skilled in computer programming or general purpose simulation languages. The computer simulation system of the present invention can be easily and efficiently used by such designers to develop and test alternate designs to more efficiently and less expensively determine the optimal system design for a particular facility.

In one presently preferred embodiment of the invention, the computer simulation system includes a CPU interconnected to an operator terminal through which information is entered by the designer specifying the various computer-controlled components and operating parameters which are to be tested in a particular design. The system designer is provided with a catalog of user-oriented language descriptions of available components from which he can select the various components and their operating parameters. The user-oriented language descriptions which are entered by the system designer are then used by the CPU to automatically create an operational prototype model for each selected component, which is then compiled by the CPU into a corresponding series of general purpose simulation statements. The statements for each operational prototype are processed by the CPU so as to determine the simulated operation of the overall system design.

In a second preferred embodiment, the CPU can serve as a host CPU which is linked to a secondary graphics CPU, which in turn is coupled to a graphics terminal and data tablet. The graphics terminal and data tablet can be used by a system designer to graphically input selections from a catalog of available computer-controlled components which can be incorporated into a proposed design for an automated manufacturing or materials handling facility. As each conmputer-controlled component is graphically entered through the data tablet, the host CPU generates the operational prototype model for each selected component. Each operational prototype model is then automatically compiled by the host CPU into a corresponding series of general purpose simulation statements which are processed so as to determine a simulated time dependent status for each component of the proposed design that is periodically updated. The simulated time dependent status of each component is used by the graphics CPU to produce an animated graphical display of the operation of the proposed facility design.

III. BRIEF DESCRIPTION OF THE DRAWINGS

Reference is next made to the drawings, in which like parts are designated with like numerals throughout, and in which.

Figure 1:
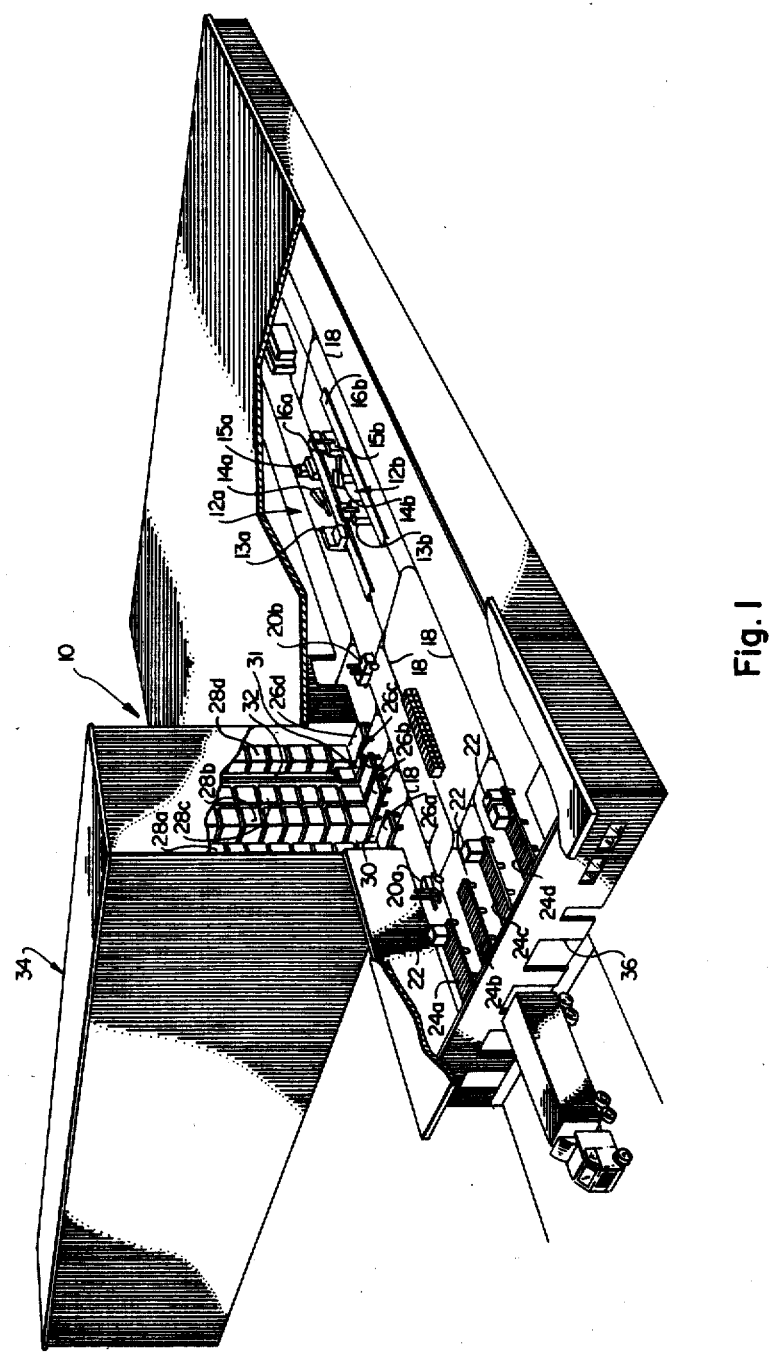
FIG. 1 is a perspective illustration which generally illustrates a simplified automated manufacturing and materials handling facility of the type which can be designed and simulated by the system and method of the present invention.
Figure 6:
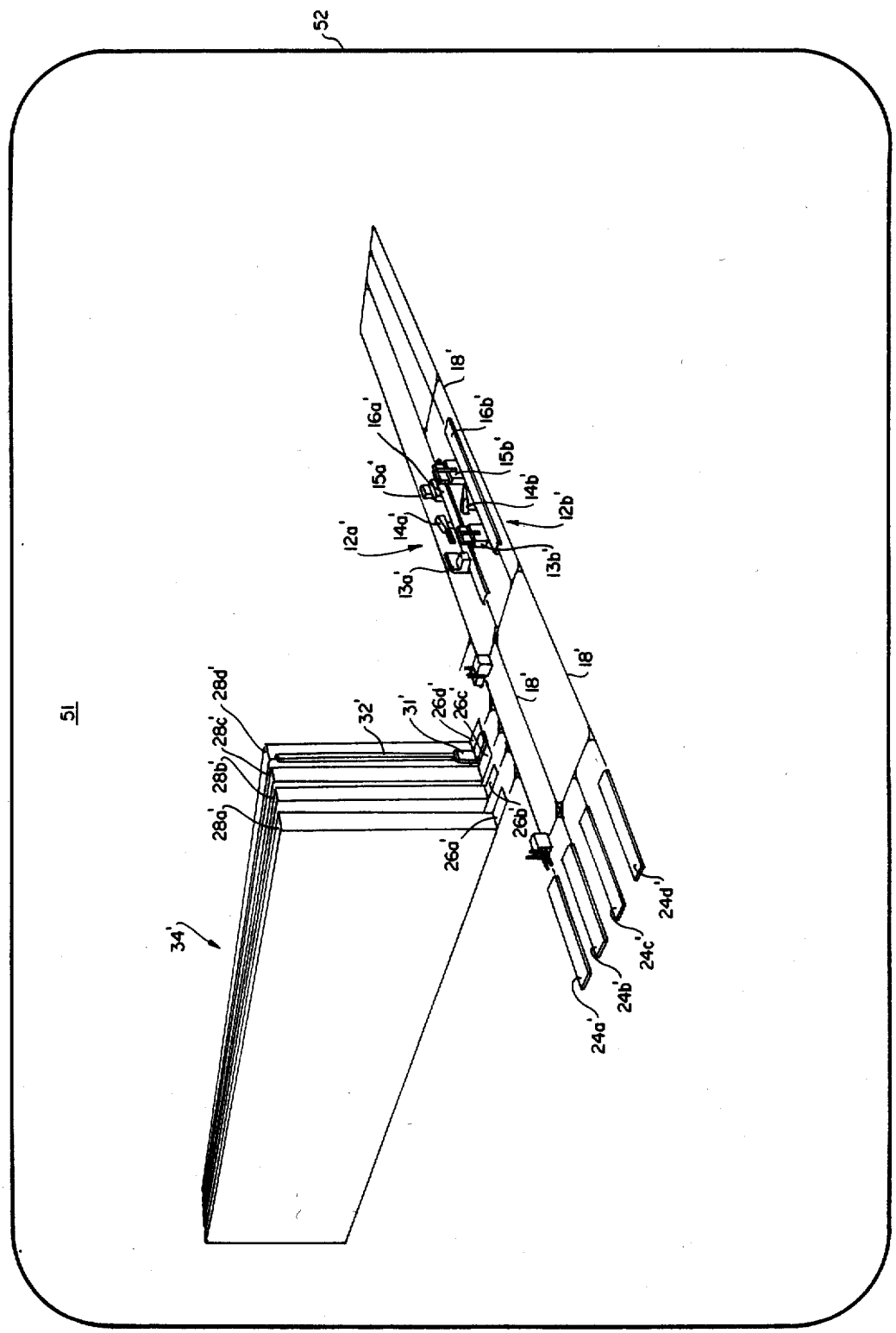

FIGS. 3a through 5b schematically illustrate examples of the way in which data arrays can be linked together so as to form generalized prototype models which can be specifically configured by operational parameters input by a system designer for purposes of testing a particular facility design; and FIG. 6 is an example of a graphical display of the type generated by the computer simulation system of the present invention for purposes of simulating an automated manufacturing and materials handling system such as that illustrated in FIG. 1.

IV. DETAILED DESCRIPTION OF THE PRESENTLY PREFERRED EMBODIMENTS

The following description begins with an illustration and general description of a simplified version of an automated manufacturing and materials handling facility of the type which can be designed and simulated using the computer system of the present invention. The general description also includes an example of an alternate design for the facility which could be simulated. The description then turns to a detailed discussion of the overall computer simulation system of this invention, including several examples of the way in which data can be organized and linked together using internal arrays in order to provide generalized prototype models for a wide variety of different types of computer-controlled components which can be selected and used by a system designer to test and evaluate various design alternatives. Included in the detailed description are specific examples of user-oriented syntax and simulation programs which are illustrative of ways in which the system and method of the present invention can be specifically implemented.

A. General Description of a Simplified Version of an Automated Manufacturing and Materials Handling Facility FIG. 1 illustrates a simplified version of an automated manufacturing and materials handling facility of the type which can be simulated using the system and method of the present invention. The overall facility is generally designated at 10. At one end of the facility, computer-controlled manufacturing equipment is stationed. As shown in the illustration of FIG. 1, the manufacturing equipment includes two machine lines generally designated at 12a and 12b. Each of the machine lines 12 have two automated machining centers 13 and 15 and a robot 14.

An automated cart-on-track conveyor 16 runs in front of each machine line 12 and is used to automatically transport products or materials to the machining centers 13, 15 and robot 14. Each cart-on-track conveyor 16 is accessed by a wire-guided track 18 which can be traversed by an automatic guided vehicle (AGV) such as vehicles 20a and 20b, which are used for transporting loads between various destinations.

A high-rise storage area generally designated at 34 is included in the facility and comprises a plurality of high-rise assemblies 28a-28d consisting of individual storage locations which are horizontally and vertically stacked. Each high-rise storage assembly 28a-28d is mounted back-to-back with another similar assembly, with an aisle 30 running between each pair of assemblies. An automated storage and retrieval (ASR) machine 32 is mounted on tracks (not shown) running down the aisle 30 between each pair of high-rise storage assemblies 28. The ASR machine 32 has a vertical mast upon which a lift plate shuttle 31 is mounted. The ASR machine 32 moves up and down each aisle 30 to a particular address which is determined by the horizontal and vertical position of a particular storage location. The lift plate shuttle 31 of the ASR machine 32 simultaneously moves up the mast to the vertical position of the storage location and, upon arrival at the storage location, either stores or retrieves a palletized load.

In its overall operation, the automated manufacturing and materials handling facility of FIG. 1 is designed so that loads 22 can be transported by an AGV 20 to the cart-on-track conveyors 16 of machine lines 12, where they can be processed at the machining centers 13 or 15 by robots 14. The loads 22 can then be transferred from the cart-on-track conveyors 16 by an AGV 20 to pick up stations 26a or 26c for storage by one of the ASR machines 32 in one of the high-rise storage assemblies 28a–28d, or to outgoing conveyors 24c or 24d for shipping. Incoming loads 22 which are unloaded at docks 36 onto conveyors 24a or 24b can also be picked up by an AGV 20 and transported to the deposit stations 26a or 26c of high-rise storage area 34. Similarly, loads can be retrieved by an ASR machine 32 and transported to a deposit station 26b or 26d, and then transported by an AGV 20 to the conveyors 24c or 24d for loading and shipment.

Figure 1A:
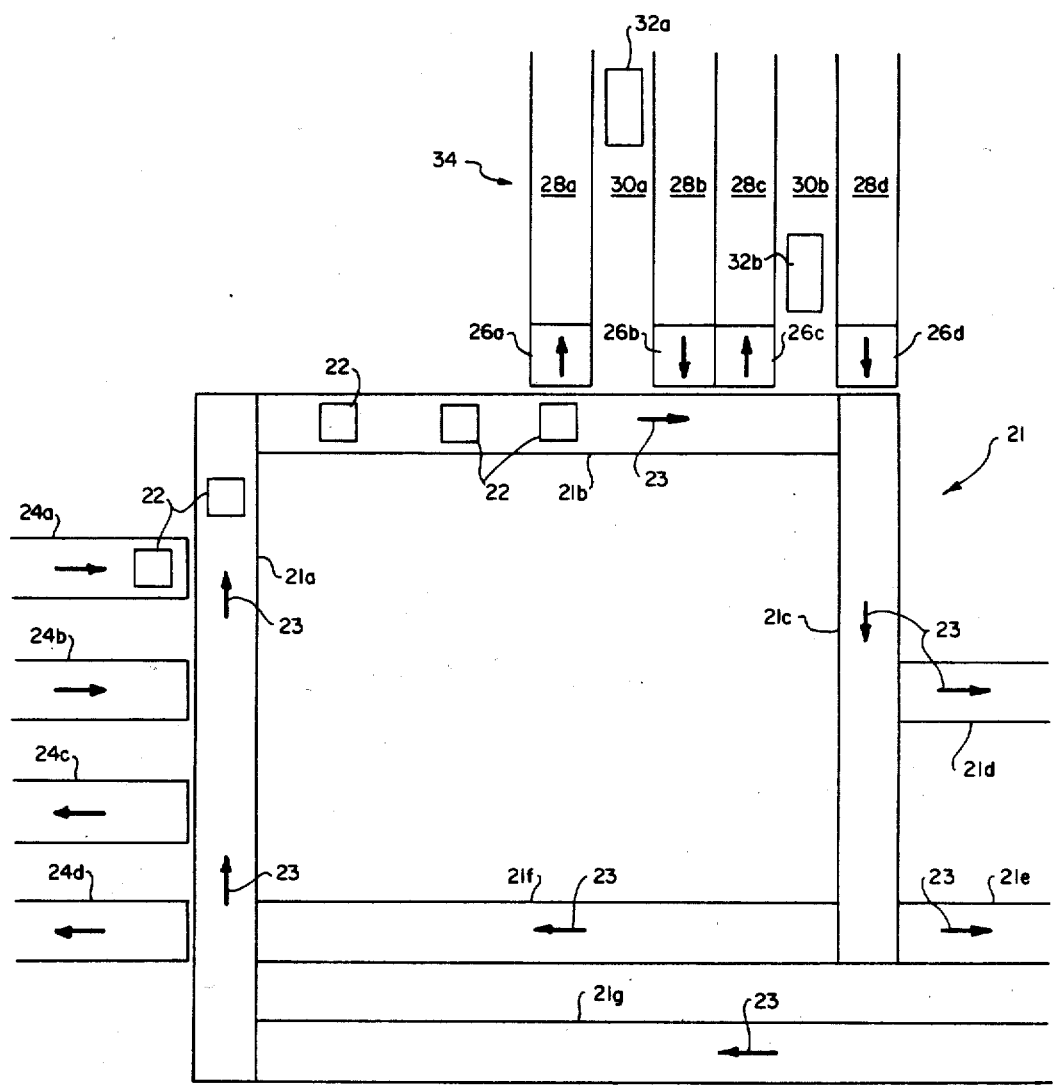
FIG. 1a is a plan view which schematically illustrates the use of a transport conveyor system which may be used in place of the automatic guided vehicles of FIG. 1 for purposes of considering an alternate design for the facility of FIG. 1.

Frequently, it is important to be able to consider different design alternatives when attempting to design an automated manufacturing and/or materials handling facility. For example, in the AM/MH facility shown in FIG. 1, it would be possible to transport the loads 22 using a transport conveyor system rather than the automatic guided vehicles 20. As schematically illustrated in FIG. 1a, the transport conveyor system generally designated at 21 consists of seven separate drive sections 21a–21g. Each of the drive sections 21a–21g is designed to transport loads in the directions schematically illustrated by arrows 23. Each drive section 21a–21g interfaces at locations which are called "to" transfer points or "from" transfer points. For example, in the case of drive section 21b, the "to" transfer points would occur at the deposit stations 26a and 26b, and at the point where drive section 21b connects to drive section 21c. The "from" transfer points for drive section 21b would occur at the location where drive section 21a connects to drive section 21b, and at the pickup station 26b.

The alternate design schematically illustrated in FIG. 1a is similar in its overall operation to that of FIG. 1. For example, incoming loads 22 from the conveyors 24a or 24b are transferred to drive section 21a. From drive section 21a, the loads may be transported to drive section 21b, where they are carried either to deposit stations 26a or 26c, or where they are transferred to the next drive section 21c. From drive section 21c, the loads can be transported to drive sections 21d or 21e to the cart-on-track conveyors 16a or 16b associated with the machine lines 12a or 12b (see FIG. 1). Loads which are transported from the cart-on-track conveyors 16a or 16b can be picked up by the conveyor system and transported along drive section 21g back to drive section 21a, where they can either be unloaded on the outgoing conveyors 24a or 24d, or where they may continue on for storage into the high-rise storage area 34. Similarly, loads can be retrieved from the high-rise storage area 34 and transferred from the pickup stations 26b or 26d onto the conveyor system 21 to be transported to other destinations in the system. FIG. 1a thus illustrates the type of alternate design that can be considered by a system designer when designing an automated manufacturing and materials handling facility.

FIGS. 1 and 1a are intended to be merely illustrative of very simplified versions of the type of automated facility which can be designed using the computer system of the present invention. The size and complexity of an automated manufacturing and/or materials handling facility is virtually unlimited, as are the various design alternatives which could be considered during the initial design stage. However, almost any such system can be efficiently simulated using the computer simulation system of the present invention. Moreover, as hereinafter more fully described, the system and method of the present invention greatly facilitates evaluation of various design alternatives, thus leading to optimal efficiency in the final design which is adopted.

B. The Computer Simulation System

Figure 2:
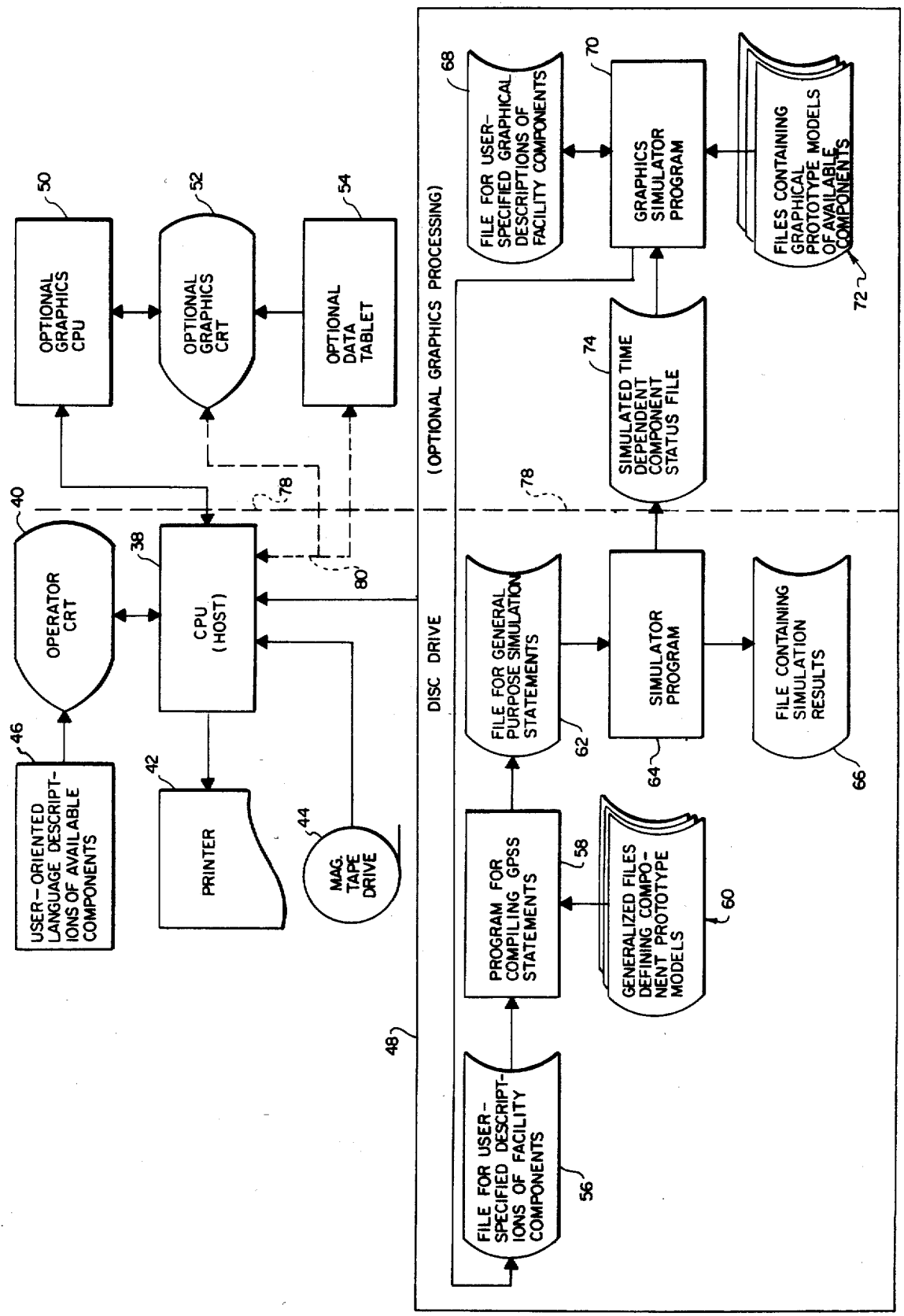
FIG. 2 is schematic block diagram which generally illustrates the computer simulation system of the present invention.

Reference is next made to FIG. 2, which schematically illustrates a preferred embodiment of the computer simulation system. As illustrated in FIG. 2, a central processing unit (CPU) 38 is interconnected to an operator terminal 40 for entry of data by a system designer. Preferably, the CPU 38 should have sufficient capability to host GPSS/V, GPSS/H or other equivalent general simulation programs. For example, the CPU 40 may be a DEC VAX (hereinafter "VAX") 750 computer with one megabyte memory or an IBM main frame 4331 computer or other comparable types of CPUs that are equivalent to the VAX or IBM machines, or that have greater capability than those machines. Appropriate system software compatible with the particular CPU selected is of course required to operate the CPU 38.

CPU 38 is also interconnected to a printer 42. Printer 42 is preferably a medium speed printer since in most cases the simulation output used to characterize the operation of a particular facility design will be substantial. As hereinafter more fully described, a disc drive 48 is interconnected to CPU 38 and is used to provide for storage or various system services, on-line data and operating programs. In the preferred embodiment, at least ten megabytes of disc storage should be available. An optional magnetic tape drive 44 can be used to provide back-up storage if desired.

Optional elements of the computer simulation system are illustrated to the right of dashed line 78, and include a graphics system comprising a secondary graphics CPU 50 which is interconnected to the host CPU 38, and a graphics terminal 52 and data tablet 54 which are connected to the CPU 50. The graphics CPU 50, terminal 52 and data tablet 54 may be, for example, an Evans & Sutherland PS 300 system, which consists of: a special purpose graphics controller; a vector-type CRT display having eight control dials for manipulating the graphics so that they can be rotated, translated, scaled, viewed in perspective or seen from any angle; a keyboard function unit; a data (i.e., drafting) tablet; a microprocessor for external interfacing; and a display processor for internal terminal functions. This architecture allows the system designer to totally control the graphics without intervention of the host CPU 38.

It will of course be appreciated that the configuration of the overall system as illustrated in FIG. 2 is merely illustrative of one presently preferred embodiment.

Other configurations could also be used. For example, the graphics CPU 50 and host CPU 38 could be replaced by a single CPU in which all of the programs which are used in the system of the present invention would be resident. In that case, the graphics terminal 52 and data tablet 54 would be interconnected to the host CPU 38, as schematically represented by the dashed line 80. Thus, the configuration illustrated in FIG. 2 is not intended to be a limitation on the scope of the invention, but is merely intended to illustrate an example of one way in which the system of the present invention can be implemented. Other equivalent configurations would be equally suitable.

With continued reference to FIG. 2, in one preferred method of operation of the computer simulation system, a catalog 46 is first prepared which contains user-oriented language descriptions corresponding to various types of computer-controlled components which may be selected by the system designer as he creates a design for an automated manufacturing and/or materials handling facility. The catalog 46 also contains user-oriented descriptions for defining specific component configurations and performance parameters.

As used herein, the terms "computer-controlled component" or "component" refer to any automated or computer-directed manufacturing or materials handling equipment, including but not limited to: ASR machines; automatic guided vehicles; computer-directed man-aboard vehicles or operator work stations; conveyors; automated work stations such as machining centers; sortation systems; transfer lines; monorail systems; or any other type of machines or systems which are used for purposes of automated or computer-directed manufacture, processing, assembly, transportation, storage and retrieval or products and materials. The terms "user-oriented language" or "user-oriented syntax" are used herein to refer to computer inputs that are specifically adapted from terms which are generally used and are familiar to designers of AM/MH facilities. It is of course apparent that many variations of user-oriented syntax could be devised and used to describe the computer-controlled components which are cataloged, one such example being a user-oriented syntax such as that represented in the microfiche Appendix A, which is incorporated herein by reference. The user-oriented language of microfiche Appendix A is called "Auto-Mod" TM, and has been developed by AutoSimulations, Inc. of Bountiful, Utah.

Using the catalog 46 of user-oriented language descriptions, the system designer selects from the available components listed in the catalog 46 those which he desires to incorporate into the design of the AM/MH facility, and he also selects the specific configuration and operating parameters for each component. Each user-oriented description is entered by the designer at the operator terminal 40. CPU 38 stores each entered description in a file 56 contained on the disc drive 48.

Disc drive 48 also contains a series of integrated internal files 60 which represent generalized prototype models for each available computer-controlled component listed in the catalog 46. The manner in which the data in files 60 is organized and linked together so as to describe each prototype will be hereinafter more fully explained using several examples. The specific component configurations and operating parameters entered by the designer from the catalog 46 are used by the CPU 38 to customize the generalized prototypes stored in files 60 so as to create specific operational prototype models for each component selected by the system designer.

With continued reference to FIG. 2, a program 58 is used to control CPU 38 so that as each user-specified description of a computer-controlled component is entered at the operator terminal 40, CPU 38 retrieves from the files 60 an operational prototype model which reflects the entered description and then compiles the operational prototype model for that component into a corresponding series of general purpose simulation statements. The statements may be in any conventional general purpose simulation language, such as GPSs or any upward compatible version of GPSS. The general purpose simulation statements are then stored by the CPU 38 in a file 62.

In this manner, each computer-controlled component selected and specified by the system designer is automatically translated into a general purpose simulation language. Advantageously, this eliminates the need for intimate understanding and experience in general purpose simulation languages and programming techniques. Another significant advantage is that the generalized files 60 and catalog 46 can be easily modified or updated to include new computer-controlled components or to reflect increased capabilities of existing components. The system is thus highly versatile. The system is also more accurate in simulating actual facility operation since the generalized prototype models incorporate simulation and control processing based upon the experience of AM/MH designers, as opposed to general simulation programmers.

The general purpose simulation statements for each prototype are processed by a general purpose simulator program 64 contained on the disc drive 48, and the output generated by program 64 is stored in a file 66 containing the simulation results. The simulation results are then printed out by CPU 38 using printer 42. The simulation results contain statistical data and information which summarize the operation of the proposed AM/MH facility design at user-specified intervals of time.

The program 58 which causes CPU 38 to identify and process each operational prototype model and to compile each prototype into a corresponding series of general purpose simulation statements can be written in any language that is compatible with the host CPU 38, and could of course be implemented using a wide variety of programming formats and logic. The program listing microfiche at microfiche Appendix B and incorporated herein by reference represents one example of programming logic and a format which may be used in the system of the present invention to provide the program 58. The program listing of microfiche Appendix B is written in the C language and may be used on either a DEC VAX 750 or IBM 4331 computer. It should be recognized that the system and method of the present invention are not intended to be limited by the program listing contained in Appendix B, which is included simply as an illustrative example.

The general purpose simulator program 64 which is used may be any type of conventional general simulation program such as the IBM GPSS simulator program Nos. 5734-XS2(OS) or 5736-XS3(DOS), or the GPSS/H program developed by Wolverine Software Corporation of Falls Church, Va.

A second preferred embodiment of the system and method of the invention includes the additional graphic system comprising an optional graphics CPU 50, a graphics terminal 52 and data tablet 54, and an optional graphics program 70 and files 68, 72 and 74 which are contained in the disc drive 48 and which are illustrated to the right of the dashed line 78 in FIG. 2. In one presently preferred method of operating this embodiment of the computer simulation system, the system designer uses the graphics terminal 52 and data tablet 54 to select graphical descriptions of each computer-controlled component to be tested in a particular design. For example, as the system designer selects the particular type of component to be used in his design, using data tablet 54 he graphically positions that component on the terminal screen 52 using the stylus (not shown) of the data tablet 54. Any conventional pointing and positioning device could be used to graphically position the selected components, such as a light pen, track ball, mouse or joystick.

As each graphical component is entered by the designer, the graphics CPU 50 stores the user-specified graphical descriptions in a file 68. File 68 is later used by the graphics CPU 50 to execute corresponding user-oriented language descriptions that are stored in file 56 as before, and to create an operational prototype model from files 72 for each user-specified component. The files generally designated at 72 contain vector coordinates which represent the graphical prototype model for each of the available computer-controlled components referenced in the catalog 46, serveral examples of such vector coordinates for an AGV, a conveyor and an ASR machine being illustrated at microfiche Appendix C, incorporated herein by reference.

The graphics simulator program 70 controls the graphics CPU 50 so that as the user-specified graphical descriptions entered at terminal 52 are stored in file 68, the corresponding language descriptions of the selected components are simultaneously generated and stored in file 56 in the same manner as though the designer had entered the language descriptions from terminal 40. Thus, general purpose simulation statements for each selected component will be compiled and stored in file 62 irrespective of whether the selections are entered using the graphics terminal 52 or the standard operator terminal 40. The general purpose simulation statements for each selected component of the facility design are then processed by the host CPU 38 using the simulator program 64 as before, and the simulation results are stored in file 66.

The host CPU 38 is also controlled by the simulator program 64 so as to establish a simulated time dependent component status file 74. As used herein, the term "simulated time dependent status" refers to the periodic change in state of each component which occurs as the overall system model is tested. Thus, the information in file 74 is periodically updated to reflect the change in state of each system component as the overall system model is tested. The graphics simulator program 70 causes the graphics CPU 50 to process each change in state entered in file 74 so as to create an animated display 51 (see FIG. 6) on the graphics terminal 52 which represents the simulated operation of the overall facility design. As shown in FIG. 6, the animated graphical display 51 contains each of the components corresponding to the actual system design (compare FIG. 1). For example, AGVs 20a' and 20b' (FIG. 6) correspond to AGVs 20a and 20b (FIG. 1), and so on.

As in the case of the program 58 used for compiling the general purpose simulation statements, the graphics simulator program 70 could be structured using a variety of different approaches to the logic and using any of several different types of computer languages, so long as the language used is compatible with the graphics CPU 50. A specific example of one suitable program listing is illustrated in microfiche Appendix D and incorporated herein by reference. The program listing of microfiche Appendix D is designed for use with a VAX 750 computer and is written in the C language.

The manner in which the data of files 60 are organized and linked together in order to form generalized prototype models for each of the available computer-controlled components referenced in the catalog 46 can best be understood by reference to several specific examples for different types of components. Accordingly, reference is next made to FIGS. 3a–3e, which schematically illustrate five arrays linked together so as to define a generalized prototype model for an automatic guided vehicle (AGV). An AGV typically represents one of the more sophisticated components and, therefore, as hereinafter more fully explained, other more simple types of components can typically be modeled using simplified versions of the data arrays of FIG. 3a–3e.

As mentioned above, based on the operational parameters entered from catalog 46, the generalized prototype for each selected component is customized so as to create a specific operational prototype. Such operational parameters include, for example, vehicle speed, vehicle acceleration and deceleration rates, track configuration and vehicle control points. The generalized arrays 82–86 are thus designed to accept such operating parameters entered by the system designer from catalog 46 and to logically link that data in a way which defines a specific operational prototype, meaning one which accurately simulates the operation and control of the particular component in question as it performs in the overall system model. In the case of an AGV, the operational prototype model accurately simulates point-to-point vehicle movement, pick up and unload protocols at destination points, enroute traffic control for collision avoidance, task assignment, and empty vehicle management. Importantly, these arrays 82–86 are linked in an efficient arrangement that can be duplicated in the application software which is later used to implement the actual component operation in the facility design. Thus, the operational prototype model effectively becomes a functional specification for the application software of the computer-controlled component. This helps to reduce installation costs for the facility.

Figure 3A:
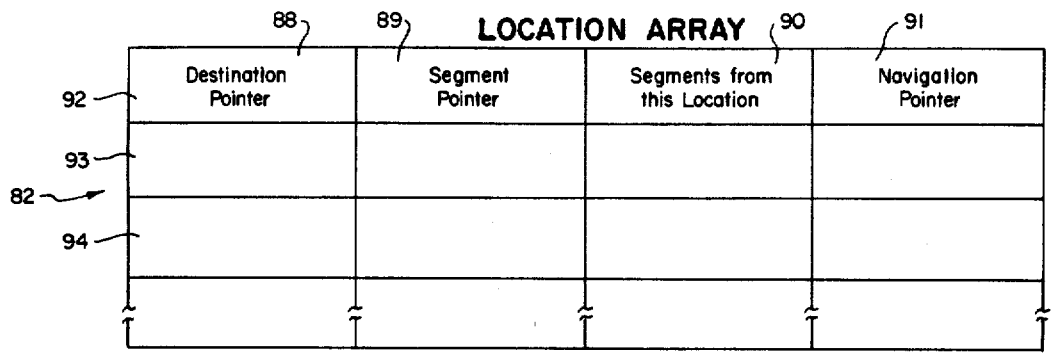
Figure 3B:
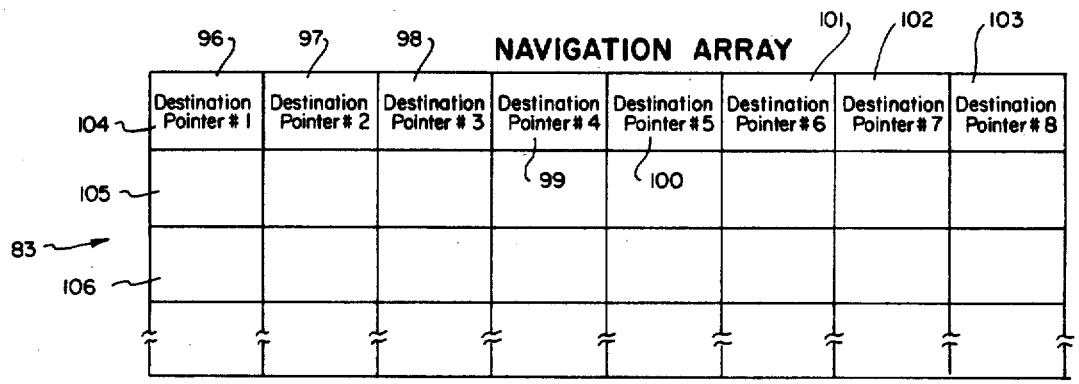
Figure 3C:
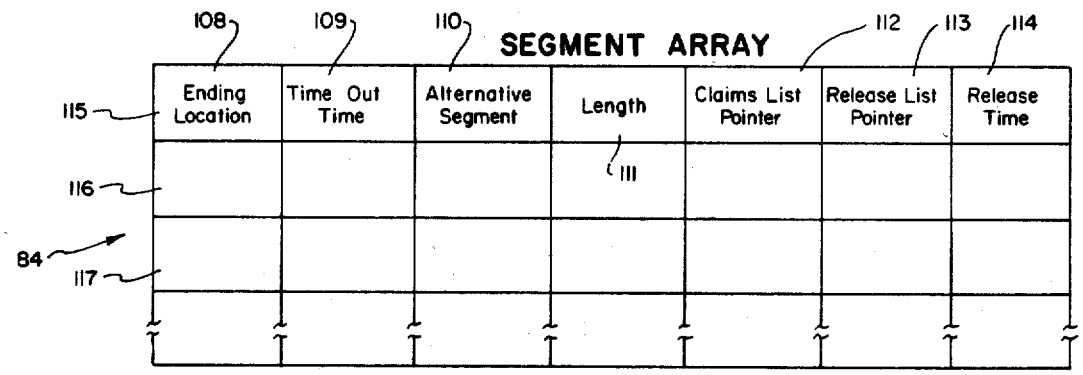
Figure 3D:

With reference first to FIG. 3a, the first array used in the operational prototype model of the AGV is a location array generally designated at 82. The location array 82 has one row, for example rows 92–94 and so on, which corresponds to each possible vehicle control point in the facility design. The various vehicle control points are positioned along the wire-guided track 18 (see FIG. 1) which is traversed by the AGVs 20. The system designer must thus specify each track or guide path segment defined by each pair of control points.

Each row of the location array 82 has four columns 88–91. Column 88 defines a destination pointer. For example, if the vehicle control point defined by a particular row of the location array 82 corresponds to a final destination point, as for example one of the pick up or deposit stations 26a–26d of the high-rise storage area 34 (see FIG. 1), then the destination pointer of column 88 points to one of the rows in the destination array 86 (FIG. 3e). As more fully explained below, each row of destination array 86 corresponds to a possible destination point for the AGV, and contains the information for controlling the AGV once it reaches that destination.

Column 89 of the location array 82 (FIG. 3a) defines a segment pointer which points to the current location of the AGV as defined by one of the segments between adjacent control points on the wire-guided track 18. The segment pointer of column 89 identifies one of the rows of the segment array 84 (FIG. 3c), which contains the information for controlling the AGV while it travels that segment.

Column 90 of the location array 82 (FIG. 3a) contains information which describes the next segment of track 18 which can be traversed by the AGV starting from its present segment location. Column 91 of the location array 82 defines a navigation pointer which points to one of the rows of the navigation array 83 (see FIG. 3b).

Each row of the navigation array 83, for example row 104–106 and so on, corresponds to each segment of the wire-guided track having more than one next segment emanating from it. The columns 96–103 for each row define the final destination points to which the AGV could travel from that segment of track. For example, the value at row 104, column 99 would contain a pointer to the segment entry (i.e., corresponding row in the segment array 84 of FIG. 3c) which should be traveled by the AGV if it is headed for the final destination point defined by column 99.

The segment array 84 has one row (i.e., rows 115–117 and so on) for each segment defined by each pair of control points positioned along the wire-guided track 18. Each row of the segment array 84 has seven columns 108–114. As mentioned, the information defined by columns 108–114 is used to control the AGV while it is traveling along the segment of the track in question.

Column 108 defines the ending location of the particular track segment. Column 109 contains information which determines whether the particular segment requires a "time-out" time, as for example in the case where two or more vehicles are deadlocked because each wants to move to the position of the other, thus requiring one vehicle to take an alternative route after the "time-out" time is reached so as to free-up the other vehicle. Column 110 of the segment array 84 defines the alternate route of the wire-guided track 18 which should be traveled by a vehicle in the event of such a deadlock. Column 111 defines the segment length, and columns 112 and 113 define pointers to a claims list stored in the one dimensional list storage array 85 (FIG. 3d) or to a release list stored in the list storage array 85, respectively. Column 114 of segment array 84 defines a release time which is used to determine the earliest possible time when an AGV which is traveling through an intersection will "release" that intersection so that another vehicle can travel through the intersection without colliding with the first vehicle.

As mentioned, the list storage array 85 (FIG. 3d) is a single dimensional array which contains claims lists, release lists, work lists, park lists, retrieval protocols, delivery protocols and intermediate protocols. The claims lists specify each segment in the wire-guided track at which two or more vehicles may arrive at the same time and which therefore must be "claimed" by first one vehicle and then "released" before the other vehicle can travel that segment. Similarly, the release lists define those points where an AGV must release a segment of track before it can be traveled by another AGV.

The work lists define the pick up point at which vehicles should look to find the next task or tasks which, when ready, are to be performed by an AGV based on the AGV's current location in the system. The park lists define the points along the wire-guided track where the AGV should look to park so as to be out of the way when not in use. Retrieval and delivery protocols contained in the list storage array 85 define the sequence of events that must be followed to retrieve or deliver a load, as the case may be, at given destinations in the facility design. For example, a typical delivery protocol at delivery stations 26a or 26c (FIG. 1) would be to enter the load 22 at the station, then inform the ASR machine 32 that a load is ready for storage. The intermediate protocol defines the events which are to be followed by the AGV if it is to be re-routed to a particular task while enroute to a destination.

As mentioned above, the destination array 86 (FIG. 3e) contains one row (i.e., rows 130–132 and so on) corresponding to each final destination point in the facility design. Examples of final destinations would be pick up and deposit stations 26a–26d (see FIG. 1), conveyors 24a–24d, or the input or output of the cart-on-track conveyors 16a and 16b. Each row of the destination array 86 has ten columns 120–129. The information contained in columns 120–129 is used to control and instruct the AGV once it reaches a final destination point.

Column 120 defines the population limit, i.e., maximum number of vehicles which can be enroute to the particular destination at any given instant of time. Column 121 defines the pick up or deposit status at the final destination, i.e., whether a load is waiting to be picked up or whether the final destination is ready to receive a new load. Column 122 contains a pointer to the work list in the list storage array 85 containing locations where a next task or tasks may be ready to be performed by the vehicle. Column 123 contains a park list pointer to a park list in the list storage array 85 which instructs the vehicle where to park in the event that none of the locations on the work list have an available task so that it will be out of the way while it is not in use.

Columns 124–127 similarly contain pointers to delivery protocol, retrieval protocol, parking protocol, and intermediate protocol, each of which are stored in the list storage array 85 as described above, and each of which are based on the destination point in question. Column 128 defines the destination of a new load picked up by the vehicle and column 129 defines the vehicle population, i.e., number of vehicles presently dispatched to that destination, which cannot exceed the number in column 120.

In summary, using the generalized system of arrays to organize and link data together in the manner described above, the operational parameters selected by a system designer from the catalog 46 can be entered at the operator terminal 40. CPU 38 then uses those operational parameters to customize the various arrays 82–86 so as to define an operational prototype model for the vehicle configuration selected by the designer.

It is emphasized that other approaches could be taken in organizing and linking the particular operational parameters so as to define an operational prototype. The particular organization of the arrays 82–86 described herein is therefore not intended to be a limitation on the scope of the system or method of the present invention, but rather is intended to simply provide an illustrative example of one presently preferred method of preparing such an operational prototype using a generalized system of data arrays used to link the various parameters which are necessary to describe vehicle operation based on a special configuration input by a system designer.

As mentioned above, other components which are more simplified in their operation and control can also be operationally described using the same type of generalized arrays as those which are used in the case of an AGV. FIGS. 4a–4c illustrate, for example, a more simplified use of the various arrays for purposes of describing a generalized prototype model for conveyor systems.

As shown in FIGS. 4a–4c, three arrays 134–136 are used. Array 134 is a section array which contains one row (i.e., rows 145–147 and so on) corresponding to each separate drive section of the conveyor system. For example, in the alternate design of FIG. 1a, each drive section 21a–21g would correspond to a separate row in the array 134.

Each row of the section array 134 has eight columns 137–144. Column 137 defines the size of the drive section in basic units of length. Column 138 defines the times that is required to move one basic unit of length along the drive section. Column 139 defines the window size for each drive section, that is, the distance which must be maintained between each load that is carried on the conveyor system. Column 140 defines the type of conveyor system in question (i.e., transport, queue, accumulation and so forth). Column 141 defines the size of a matrix that is used to record the location of the loads on the drive section.

Column 142 defines a pointer to the number of basic units of length that the drive section has advanced in a given time interval. Loads being transported on the drive section test this number (called "block count") to determine if they have arrived at their transfer location. For example, a load 22 entering drive section 21b from drive section 21a (see FIG. 1a) may have 40 feet to travel to reach its transfer point at deposit station 26a. At any given point of time, if the block count is not equal to 40 feet, the load continues its course of travel to the transfer point.

Column 143 defines a pointer to a row in the transfer array 136 (FIG. 4c) defining the last transfer point which links the current drive section to a "to" section. For example, in the case of drive section 21b (FIG. 1a), the last "to" section (i.e., section to which loads can be transferred) is drive section 21c. Thus, in the case of drive section 21b, the last transfer point to a "to" section occurs at the very end of the drive section 21b.

Column 144 defines a pointer to a row in array 135 which has one row (i.e., rows 153–156 and so on) for each drive section that has more than one "to" section emanating from it. Each row of the navigation array 135 has a separate column, (i.e., columns 149–152 and so on), for each final destination that can be accessed from that particular drive section. For example, from drive section 21b of FIG. 1a, pick up or deposit stations 26a–26c can be accessed.

The transfer array 164 has one row (for example rows 162–164 and so on) corresponding to each transfer point or connection between adjacent drive sections of the conveyor system. Each row of the transfer array 136 has five columns 157–161. Column 157 defines the location of the conveyor system at which the transfer point is found. Column 158 describes the next drive section that is linked by the transfer point from the last drive section. Column 159 describes the location at which the load enters the next drive section when transferred, while column 160 describes the type of transfer point (i.e., right angle, straight and so forth). Column 161 defines the time required to complete the transfer from the last drive section to the next drive section.

As another example of the way in which the generalized prototype arrays can be used for modeling an even less complicated component, in a tilt tray sortation system the trays always move from one fixed location to an adjacent fixed location as a chain pulls the trays through their course. Thus, there are no drive sections which have multiple "to" sections to which loads can be transferred and therefore the navigation array 135 is eliminated in that case. The transfer array of a tilt tray sortation system becomes a single row list and, for convenience, can be appended directly to the section array.

In summary, the various arrays which are used to develop a generalized prototype model for describing the operation and control of a conveyor system, a tilt tray sortation system, or other such components typically is based on a simplification of the same general approach which is used in the case of more complicated components such as an AGV.

The foregoing examples describing the use of the generalized arrays is based on the assumption that the computer-controlled components which are being modeled are used to carry out tasks which are randomly assigned to the components in question. There is also a second general type of case in which a computer-controlled component, for example an ASR machine, is required to perform tasks which are known in advance of the time when the task must actually be completed. An example of the type of generalized data arrays which can be internally linked to accommodate this type of task assignment is illustrated in FIGS. 5a and 5b, as used in connection with the example of an ASR machine.

As illustrated in FIGS. 5a and 5b, two arrays are used, a task type array 162 and a task node array 163. The task type array 162 (FIG. 5a) has a row (for example rows 164–166 and so on) for each type of task which might be required. The actual number of tasks depends on the particular system. For example, in the case of an ASR machine with a possible man aboard picking module, the following types of tasks would be typical: for each storage aisle 30 (see FIG. 1), a list of receipts is assigned to the aisle which have not yet been assigned to a vehicle; for each storage aisle 30, a list of the pending issues which need to be picked from the aisle; for each storage aisle, a list of the inspections which still need to be performed in the aisle; for each vehicle, a list of the receipts on board; for each vehicle, a list of the issues on board; or if there are storage modules which can be moved on and off the vehicle, then for each storage module a list of the receipts on the module.

Each row of the task type array 162 comprises a pointer to a header of a singly linked list of task nodes, and is organized into a format having three columns 168–170. Column 168 defines the size (i.e., number of nodes) of a task list. Column 2 defines a pointer to the first node on the task list. Since each of the rows (for example rows 171–173 and so on), of the task node array 163 correspond to the number of tasks which may exist for the ASR machine at any one moment, the first task node pointer of column 169 indexes one of the rows in the task node array 163 corresponding to the beginning of the task list. Similarly, column 170 of the task type array 162 points to the last task node (i.e., last task on the list) which again indexes one of the rows in the task node array 163.

In the task node array 163, as mentioned each row corresponds to one of the tasks which may be contained in the task list at any given time. Each row of task node array 163 has a format having three columns 175–177. Column 175 defines the type of task (i.e., receipt, issue, inspection and so forth) and the status of the task (i.e., pending, assigned to a vehicle, completed, and so on). Column 176 defines the time when the task was created and column 177 defines a pointer to the next node or next task in the particular list.

When tasks are created they are linked onto lists associated with the aisles to which they are assigned. When the tasks are assigned to vehicles, they are unlinked from the aisle lists and are linked onto the lists of the vehicle to which they are assigned. Tasks are moved from one task category to any other by unlinking them from the current node list and linking onto another list with appropriate changes in the task type array pointers contained at columns 169, 170 and 177. Significantly, this method of control allows the system designer to employ any prioritizing of tasks which are known in advance.

Specific examples of the generalized prototype arrays for an AGV, conveyor system, tilt tray sortation system and ASR machine, as described above, are described in microfiche Appendix E incorporated herein by reference.

In conclusion, the computer simulation system and method of the present invention successfully overcomes the problems of the prior state of the art. In particular, the system and method of the present invention have been designed so that automated manufacturing and/or materials handling facilities can be efficiently and inexpensively modeled by system designers who are experienced in the art of AM/MH design without the need for intimate familiarity with general purpose simulation languages and programming techniques. The computer simulation system of this invention thus permits alternative designs to be efficiently and economically evaluated so that optimal facility design can be achieved. The computer simulation system and method of the present invention also provide a highly versatile system which can be easily updated to reflect changes in capability or technology, and which is highly accurate.

The invention may be embodied in other specific forms without departing from its spirit or essential characteristics, and the preferred embodiments as described herein should be considered in all respects only as illustrative and not restrictive. The scope of the invention is therefore indicated by the appended claims rather than by the foregoing description, and all changes which come within the meaning and range of equivalency of the claims are to be embraced within their scope.

What is claimed and desired to be secured by U.S. Letters Patent is:

1. A computer system for simulating a user-specified automated manufacturing and/or materials handling (AM/MH) facility which includes as part of the facility a plurality of different types of computer-controlled components, said computer-controlled components being listed in a catalog means containing user-oriented language descriptions adapted for input by a system user to a CPU, and said system comprising:

a central processing unit (CPU);

first means, electronically connected to said CPU, for inputting to said CPU said descriptions for said computer-controlled components which are to be simulated by said system;

second means, electronically connected to said CPU, for outputting information from said CPU; and third means, electronically connected to said CPU, for controlling said CPU so as to generate at said second means a simulation which represents a working model of said user-specified AM/MH facility based on said component descriptions input to said CPU.

2. A computer system as defined in claim 1 wherein said means for cataloging comprises a plurality of graphical descriptions corresponding to said various types of computer-controlled components available for use in said facility, and wherein said system further comprises:

fourth means, electronically connected to said CPU, for graphically entering and outputting information to and from said CPU; and wherein said third means further comprises means for controlling said CPU so as to generate at said fourth means an animated graphical display of said simulated working model, said animated graphical displays being generated in response to graphical descriptions selected by a system user from said cataloging means and input to said CPU through said fourth means.

3. A computer system as defined in claim 1 wherein said third means further comprises:

a first series of electronically stored files containing a plurality of arrays defining generalized prototype models of said various computer-controlled components available for use in said facility;

a second electronically stored file for receiving said user-oriented language descriptions of the computer-controlled components entered through said first means;

means, electronically linked to said first series of files and to said second file, for (a) creating from user-oriented language descriptions stored in said second file an operational prototype model of each said component to be used in said facility and for (b) compiling each operational prototype model into a corresponding series of general purpose simulation statements;

a third electronically stored file for receiving each said statement;

means, electronically linked to said third file, for processing said statements so as to generate therefrom a simulated working model of said user-specified AM/MH facility; and a fourth electronically stored file for receiving the information which describes said simulated working model to be output at said second means.

4. A computer system as defined in claim 3 wherein said arrays defining said generalized prototype models comprise means for modeling one or more components that are selected to perform random task assignments in said AM/MH facility.

5. A computer system as defined in claim 3 wherein said arrays defining said generalized prototype models comprise means for modeling one or more components that are selected to perform task assignments in said AM/MH facility that are known and prioritized in advance of the time that such tasks are to be performed by said components.

6. A computer system as defined in claim 3 wherein said catalog means comprises a plurality of graphical descriptions corresponding to said various types of computer-controlled components available for use in said facility, and wherein said system further comprises:
   fourth means, electronically connected to said CPU, for graphically entering and outputting information to and from said CPU; and
   wherein said third means further comprises:
      a fifth electronically stored file containing a plurality of graphical descriptions corresponding to graphical prototype models of the various computer-controlled components available for use in said facility;
      a sixth electronically stored file linked to said means for processing said statements, said sixth file containing data defining a simulated time dependent status of all said components to be used in said facility;
      a seventh electronically stored file for receiving each graphical description of the components entered from said catalog means through said fourth means; and
      means, electronically linked to said second, fifth, sixth and seventh files, for (a) identifying from said graphical descriptions entered through said fourth means the graphical prototype model and user-oriented language description of each component to be used in said facility, and for (b) processing the data from said sixth file so as to generate at said fourth means a simulated working model in the form of an animated graphical display of said user-specified AM/MH facility.

7. A computer system for simulating a user-specified automated manufacturing and/or materials handling (AM/MH) facility which includes as part of the facility a plurality of different types of computer-controlled components, each said component being listed in a catalog means containing user-oriented language descriptions adapted for input by a system user to a CPU, and said system comprising:
   a central processing unit (CPU);
   first means, electronically connected to said CPU, for inputting to said CPU a plurality of said descriptions selected by the system user from said catalog means;
   second means, electronically connected to said CPU, for outputting information from said CPU; and
   third means, electronically connected to said CPU, for controlling said CPU so as to generate at said second means a simulation which represents a working model of said user-specified AM/MH facility based on said component descriptions input to said CPU and said third means comprising:
      a first series of electronically stored files containing a plurality of arrays defining generalized prototype models of said various computer-controlled components listed is said catalog means;
      a second electronically stored file for receiving said user-oriented language descriptions of the computer-controlled components entered through said first means;
      means, electronically linked to said first series of files and to said second file, for (a) creating from the user-oriented language descriptions stored in said second file an operational prototype model of each said component to be used in said facility and for (b) compiling each operational prototype model into a corresponding series of general purpose simulation statements;
      a third electronically stored file for receiving each said statement;
      means, electronically linked to said third file, for processing said statements so as to generate therefrom a simulated working model of said user-specified AM/MH facility; and
      a fourth electronically stored file for receiving the information which describes said simulated working model to be output at said second means.

8. A computer system as defined in claim 7 wherein said catalog means comprises a plurality of graphical descriptions corresponding to said various types of computer-controlled components available for use in said facility, and wherein said system further comprises:
   fourth means, electronically connected to said CPU, for graphically entering and outputting information to and from said CPU; and
   wherein said third means further comprises:
      a fifth electronically stored file containing a plurality of graphical descriptions corresponding to graphical prototype models of the various computer-controlled components listed in said catalog means;
      a sixth electronically stored file linked to said means for processing said statements, said sixth file containing data defining the simulated time dependent status of all said components listed in said catalog means;
      a seventh electronically stored file for receiving each graphical description of the components entered from said catalog means through said fourth means; and
      means, electronically linked to said second, fifth, sixth and seventh files, for (a) identifying from said graphical descriptions entered through said fourth means the graphical prototype model and user-oriented language description of each component to be used ins aid facility, and for (b) processing the data from said sixth file so as to generate at said fourth means a simulated working model in the form of an animated graphical display of said user-specified AM/MH facility.

9. In a computer system having a central processing unit (CPU), first means electronically connected to said CPU for entering information from an operator to said CPU, second means electronically connected to said CPU for outputting information from said CPU, and third means electronically connected to said CPU for electronically storing information and data sued to control said CPU, a method of simulating an automated manufacturing and/or materials handling (AM/MH) facility comprising the steps of:
   (a) preparing a catalog listing a plurality of user-oriented language descriptions corresponding to various types of computer-controlled components available for use in said facility;
   (b) inputting to said CPU at said first means a plurality of user-oriented language descriptions which describe the computer-controlled components selected by a system user from said catalog and which are to be used by said system to simulate a user-specified AM/MH facility; and
   (c) said CPU processing each one of said user-oriented language descriptions entered in step so as to generate at said second means a simulated working model of said user-specified AM/MH facility based on said user-oriented language descriptions input to said CPU.

10. A method as defined in claim 9 wherein said computer system further includes fourth means electronically connected to said CPU for graphically entering and outputting information to and from said CPU, and wherein:
- said step (a) comprises listing in said catalog a plurality of graphical descriptions corresponding to said various types of computer-controlled components in addition to said user-oriented language descriptions;
- said step (b) comprises inputting to said CPU at said fourth means a plurality of user-specified graphical descriptions which describe the computer-controlled components to be simulated by said system; and
- said step (c) comprises processing each one of said user-specified graphical descriptions input to said CPU so as to generate at said fourth means an animated graphical display of said simulated working model of the AM/MH facility.

11. In a computer system having a centeral processing unit (CPU), first means electronically connected to said CPU for entering information from an operator to said CPU, second means electronically connected to said CPU for outputting information from said CPU, and third means electronically connected to said CPU for electronically storing information and data used to control said CPU, a method of operating said system to simulate an automated manufacturing and/or materials handing (AM/MH) facility comprising the stpes of:
  (a) preparing a catalog listing a plurality of user-oriented language descriptions corresponding to various types of computer-controlled components available for use in said facility;
  (b) electronically storing in said third means a series of files containing a plurality of generalized prototype models of each said computer-controlled component available for use in said facility;
  (c) inputting to said CPU at said first means a plurality of user-oriented language descriptions which describe the computer-controlled components selected by a system user from said catalog, and which are to be used by said system to simulate a user-specified AM/MH facility;
  (d) said CPU creating from said series of files stored in step (b) an operational prototype model corresponding to each component entered in step (c) and compiling each operational prototype model into a corresponding series of general purpose simulation statements;
  (e) said CPU storing in said third means a file containing each said statement compiled in step (d);
  (f) said CPU processing the statements stored in step (e) so as to generate therefrom a simulated working model of said facility;
  (g) said CPU storing in said third means an output file containing information which describes said simulated working model; and
  (h) said CPU outputting at said second means a description of said simulated working model from the information stored in step (g).

12. A method as defined in claim 11 wherein said computer system further includes a secondary CPU and fourth means electronically connected to said CPU for graphically entering and outputting information to and from said CPU, said method further comprising the steps of:
  (i) listing in said catalog a plurality of graphical descriptions which depict said types of computer-controlled components available for selection by said system user;
  (j) electronically storing in said third means a file containing a plurality of descriptions corresponding to graphical prototype models of each said computer-controlled component listed in said catalog;
  (k) inputting to said CPU at said fourth means a plurality of user-specified graphical descriptions which describe the computer-controlled components selected by said system user for simulating said facility;
  (l) said CPU electronically storing in said third means a file containing each user-specified description input in step (k);
  (m) said CPU indentifying from the files stored in steps (j) and (l) the graphical prototype model and user-oriented language description of each component to be used in simulating said facility;
  (n) said CPU preparing a simulated time dependent status file from said statements processed in step (f);
  (o) said CPU processing the data from said simulated time dependent status file so as to generate an animated graphical representation of said simulated working model of said facility; and
  (p) said secondary CPU outputting at said fourth means said animated graphical representation of said simulated working model.

13. A method as defined in claim 11 wherein said files containing said generalized prototype models stored in step (b) comprise means for modeling one or more components which are selected to perform random task assignments in said AM/MH facility.

14. A method as defined in claim 11 wherein said files containing said generalized prototype models stored in step (b) comprise means for modeling one or more components which are selected to perform a series of task assignments that are assigned in advance to said components.

* * * * *

UNITED STATES PATENT AND TRADEMARK OFFICE
CERTIFICATE OF CORRECTION

PATENT NO. : 4,604,718

DATED : August 5, 1986

INVENTOR(S) : Theodore A. Norman et al.

It is certified that error appears in the above-identified patent and that said Letters Patent is hereby corrected as shown below:

```
    Column 8, line 12, "GPSs" should be --GPSS--
    Column 8, line 49, "microfiche at microfiche" should be
--at microfiche--
    Column 8, line 58, "Appendix B" should be --microfiche
Appendix B--
    Column 9, line 28, "serveral" should be --several--
    Column 11, line 18, "row" should be --rows--
    Column 13, line 24, "times" should be --time--
```

Signed and Sealed this

Sixth Day of January, 1987

*Attest:*

DONALD J. QUIGG

*Attesting Officer*   *Commissioner of Patents and Trademarks*